US007567194B2

(12) United States Patent
Hasegawa

(10) Patent No.: US 7,567,194 B2
(45) Date of Patent: Jul. 28, 2009

(54) DELTA SIGMA MODULATOR AND DELTA SIGMA A/D CONVERTER

(75) Inventor: Kazuo Hasegawa, Gunma (JP)

(73) Assignees: Sanyo Electric Co., Ltd., Moriguchi-shi (JP); Sanyo Semiconductor Co., Ltd., Ora-gun (JP)

( * ) Notice: Subject to any disclaimer, the term of this patent is extended or adjusted under 35 U.S.C. 154(b) by 0 days.

(21) Appl. No.: 12/143,331

(22) Filed: Jun. 20, 2008

(65) Prior Publication Data

US 2008/0316075 A1 Dec. 25, 2008

(30) Foreign Application Priority Data

Jun. 21, 2007 (JP) ............................ 2007-163608

(51) Int. Cl.
*H03M 3/00* (2006.01)

(52) U.S. Cl. ...................................... 341/143; 331/157

(58) Field of Classification Search ......... 341/143-170; 331/57

See application file for complete search history.

(56) References Cited

U.S. PATENT DOCUMENTS 4,887,085 A * 12/1989 Moyal ........................ 341/169
6,670,859 B2 * 12/2003 Sanduleanu .................. 331/57
6,831,524 B1 * 12/2004 Krawczyk et al. ............. 331/57
6,972,635 B2 * 12/2005 McCorquodale et al. .... 331/167
7,382,300 B1 * 6/2008 Nanda et al. ................ 341/143
7,466,257 B2 * 12/2008 Akizuki et al. .............. 341/143
7,508,330 B1 * 3/2009 Chandra ..................... 341/143
7,532,138 B2 * 5/2009 Akizuki et al. .............. 341/143
7,538,705 B2 * 5/2009 Deval et al. ................. 341/143

FOREIGN PATENT DOCUMENTS

JP 9-205369 8/1997
JP 2002-100992 4/2002

* cited by examiner

*Primary Examiner*—Lam T Mai
(74) *Attorney, Agent, or Firm*—Morrison & Foerster LLP

(57) ABSTRACT

With a delta sigma modulator of this invention, a plurality of clocks required to control a switching circuit can be easily generated and correlation among phases of the plurality of clocks can be automatically maintained while a frequency of the clocks is modified. A ring oscillator is formed of three delay circuits provided with differential amplifiers in the delta sigma modulator. A clock producing circuit produces the plurality of clocks to control the switching circuit by delaying three-phase clocks outputted from the ring oscillator. All the tail currents Ic in the differential amplifiers in the delay circuits in the ring oscillator and the tail currents Ic in the differential amplifiers in the delay circuits in the clock producing circuit are proportional to each other.

4 Claims, 9 Drawing Sheets

DIGITAL FILTER
6
ONE-BIT DAC
1
4A
φ1E
Vo2p
Vo2n
3B
C1
C1
S10
S10
S9
S9
Cs2
Cs1
S6
S6
Cs1
Cs2
Vr1p
Vr1n
S8
S7
S5
S5
S7
S8
3
3A
Vo1p
Vo1n
2B
MID VOLTAGE
MID VOLTAGE
C1
C1
S4
S4
S3
S3
Cs
Cs
S2
S2
Vr1p
Vr1n
2
S1
S1
Vip
Vin
2A

Vdd
Vcc
10
20
21
22
I1
BIAS
11A
11B
11C
12A
12B
12C
DELAY CIRCUIT
IN+
IN-
OUT-
OUT+
BUFFER
A
*A
B
*B
C
*C

Vcc
IN+
IN-
BIAS
GND
Ic
M1
M2
M3
M4
M5
M6
M7
M8
M9
M10
M12
M13
M14
OUT-
OUT+
111:DIFFERENTIAL AMPLIFIER
112:OUTPUT CIRCUIT

A
B
C
A
D
(=A·*B)
E
(=*A·B)
120°
120°
120°

30
31
33
36A
Vcc
LOGIC CIRCUIT
D
DELAY CIRCUIT
BUFFER
φ 1
A
*A
B
*B
36B
BUFFER
φ 1E
34
36C
DELAY CIRCUIT
BUFFER
φ 1D
*φ 1D
32
BIAS
36D
LOGIC CIRCUIT
E
BUFFER
φ 2
35
DELAY CIRCUIT
BUFFER
φ 2D
*φ 2D
36E
GND in
out
FIRST INTEGRATOR
2
SECOND INTEGRATOR
3
QUANTIZER
4
ONE-BIT DAC
1
DIGITAL FILTER
6
CLOCK GENERATION CIRCUIT
5

1.8V
51
M3
M4
M1
M2
Cinp
Cinn
CK
CKD
52

DELTA SIGMA MODULATOR AND DELTA SIGMA A/D CONVERTER

CROSS-REFERENCE OF THE INVENTION

This application claims priority from Japanese Patent Application No. 2007-163608, the content of which is incorporated herein by reference in its entirety.

BACKGROUND OF THE INVENTION

1. Field of the Invention

This invention relates to a delta sigma modulator, specifically to a delta sigma modulator provided with an integrator equipped with a switching circuit and a D/A converter that converts an output of the integrator into an analog output, in which the output of the D/A converter is fed back to the integrator. This invention also relates to a delta sigma A/D converter provided with a digital filter in addition to the delta sigma modulator.

2. Description of the Related Art

FIG. 7 is a block diagram showing a conventional delta sigma modulator (ΔΣ modulator). In the delta sigma modulator, a first integrator 2 integrates a sum of an input signal and an output of a one-bit D/A converter 1, a second integrator 3 further integrates a sum of an output of the first integrator 2 and the output of the one-bit D/A converter 1, and a quantizer 4 quantizes an output of the second integrator 3 to generate a one-bit digital signal. The one-bit digital signal outputted from the quantizer 4 is converted by the one-bit D/A converter 1 into an analog signal that is the output of the one-bit D/A converter fed back and inputted to the first integrator 2 and the second integrator 3.

Each of the first integrator 2 and the second integrator 3 is provided with a switching circuit composed of a plurality of switches and a plurality of capacitors and an operational amplifier having an input terminal and an output terminal connected with each other through a capacitor. Charge/discharge cycles of the capacitors are controlled by controlling turning on/off of the plurality of switches. A clock generation circuit 5 provides a plurality of clocks to control the turning on/off of the plurality of switches.

The delta sigma modulator outputs a clock signal with a duty ratio that varies corresponding to a level of the input signal, as shown in FIG. 8. For example, the duty ratio of the output clock signal is 50% when the level of the input signal is equal to a center voltage of a dynamic range of the input signal, the duty ratio becomes larger than 50% when the level of the input signal gets closer to an upper limit of the dynamic range, and the duty ratio becomes less than 50% when the level of the input signal gets closer to a lower limit of the dynamic range. The delta sigma A/D converter is obtained by adding a digital filter 6 that reduces quantization noise in the output of the delta sigma modulator caused by the quantizer 4.

The plurality of clocks differs from each other in rising timing and falling timing. In other words, they differ from each other in phase. The clock generation circuit 5 is made of a circuit as shown in FIG. 9 in order to generate the clocks as described above. That is, the clocks to control the switches are generated by level-shifting an externally inputted clock with a level shifter 51 and delaying the level-shifted clock by a delay circuit 52 that is made of a plurality of inverters connected in series. The delay time of the plurality of clocks is adjusted by the number of inverters. A clock $CK_D$ is delayed relative to a clock CK in an example shown in FIG. 9.

Further descriptions on the delta sigma modulator are provided in Japanese Patent Application Publication Nos. 2002-100992 and H09-205369, for example.

However, since the delay time of the clocks is adjusted by the number of the inverters in the clock generation circuit 5 in the conventional delta sigma modulator, it is difficult to increase the delay time of the clocks significantly (because the number of the inverters increases significantly).

In addition, when a frequency of the input clock is varied to modify an operational frequency of the delta sigma modulator, the number of inverters in the delay circuit 52 has to be adjusted in order to maintain correlations among the phases of the clocks as required.

SUMMARY OF THE INVENTION

This invention offers a delta sigma modulator having an integrator provided with a switching circuit, a D/A converter that performs D/A conversion of an output of the integrator and a clock generation circuit. An output of the D/A converter is fed back to the integrator. The clock generation circuit has a ring oscillator composed of a plurality of first differential amplifiers connected with each other and a plurality of second operational amplifiers that delays clocks generated by the plurality of first differential amplifiers and having phases different from each other. The switching circuit is controlled using a plurality of clocks outputted from the plurality of second differential amplifiers. A plurality of tail currents flowing through the first differential amplifiers and the plurality of second differential amplifiers is made proportional to each other.

DETAILED DESCRIPTION OF THE INVENTION

Figure 1:
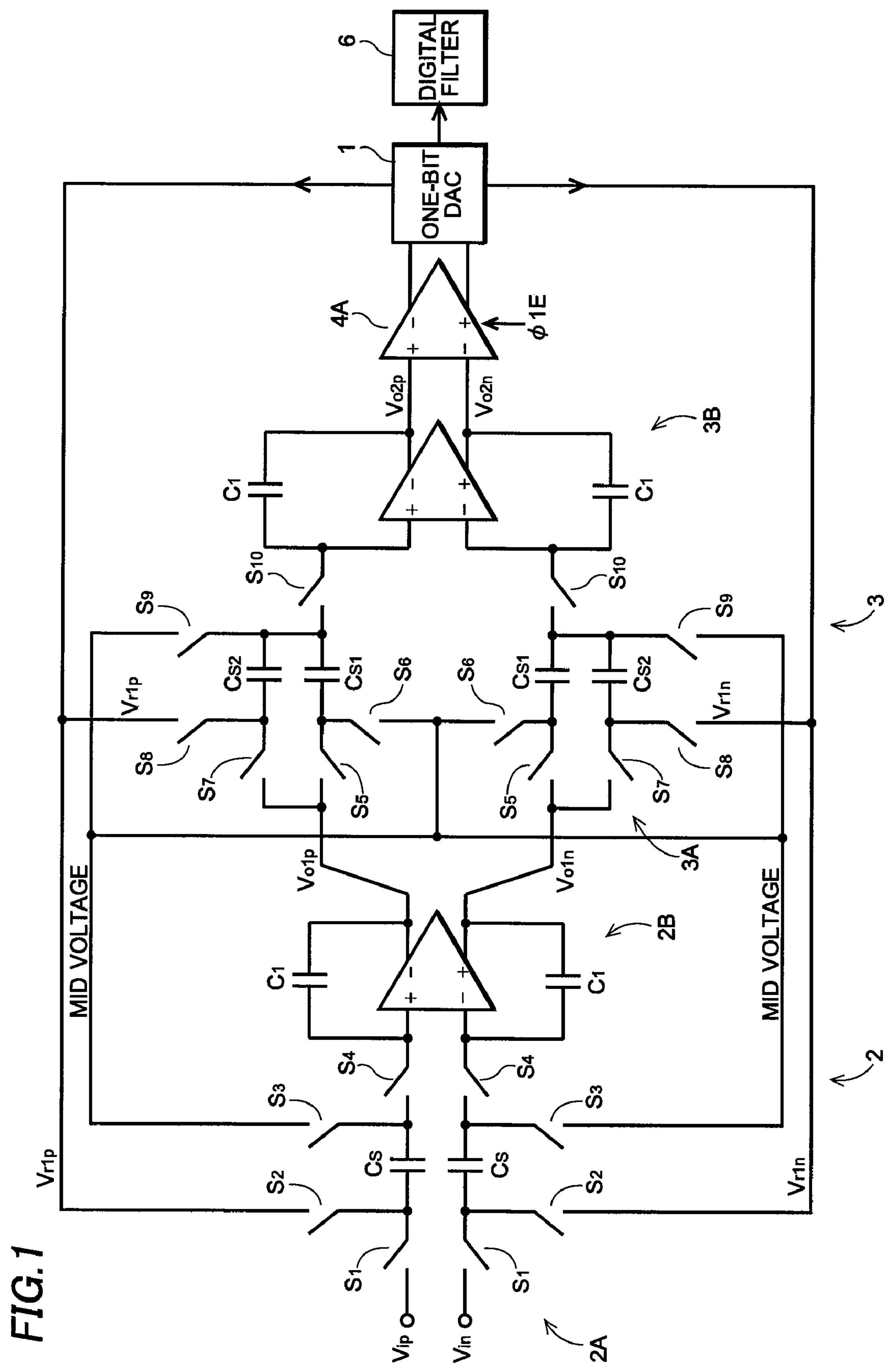
FIG. 1 shows a circuit diagram of integrators in a delta sigma modulator according to an embodiment of this invention.

A delta sigma modulator according to an embodiment of this invention will be described referring to the drawings. The delta sigma modulator according to the embodiment of this invention is characterized by a structure of a clock generation circuit 5. Otherwise, the basic structural blocks of the delta sigma modulator are similar to the conventional delta sigma modulator shown in FIG. 7. FIG. 1 shows a concrete circuit diagram of the delta sigma modulator according to the embodiment of this invention. Since an input signal is given by a pair of differential input voltages Vip and Vin in the embodiment of this invention, circuits shown in FIG. 1 are formed of differential-type circuits.

A first integrator 2 (first stage) is formed of a first switching circuit 2A made of switches S1, S2, S3 and S4 and capacitors Cs and a first operational amplifier 2B having a pair of input terminals and output terminals each connected with each other through a capacitor C1. The pair of input voltages Vip and Vin is inputted to the first switching circuit 2A that controls charging/discharging of the capacitors C1.

A pair of output voltages Vo1*p* and Vo1*n* of the first operational amplifier 2B is inputted to a second integrator 3 (second stage). The second integrator 3 is formed of a second switching circuit 3A made of switches S5, S6, S7, S8, S9 and S10 and capacitors Cs1 and Cs2 and a second operational amplifier 3B having a pair of input terminals and output terminals each connected with each other through a capacitor C1. The pair of output voltages Vo1*p* and Vo1*n* of the first operational amplifier 2B is inputted to the second switching circuit 3A that controls charging/discharging of capacitors C1 in the second integrator 3.

Figure 7:
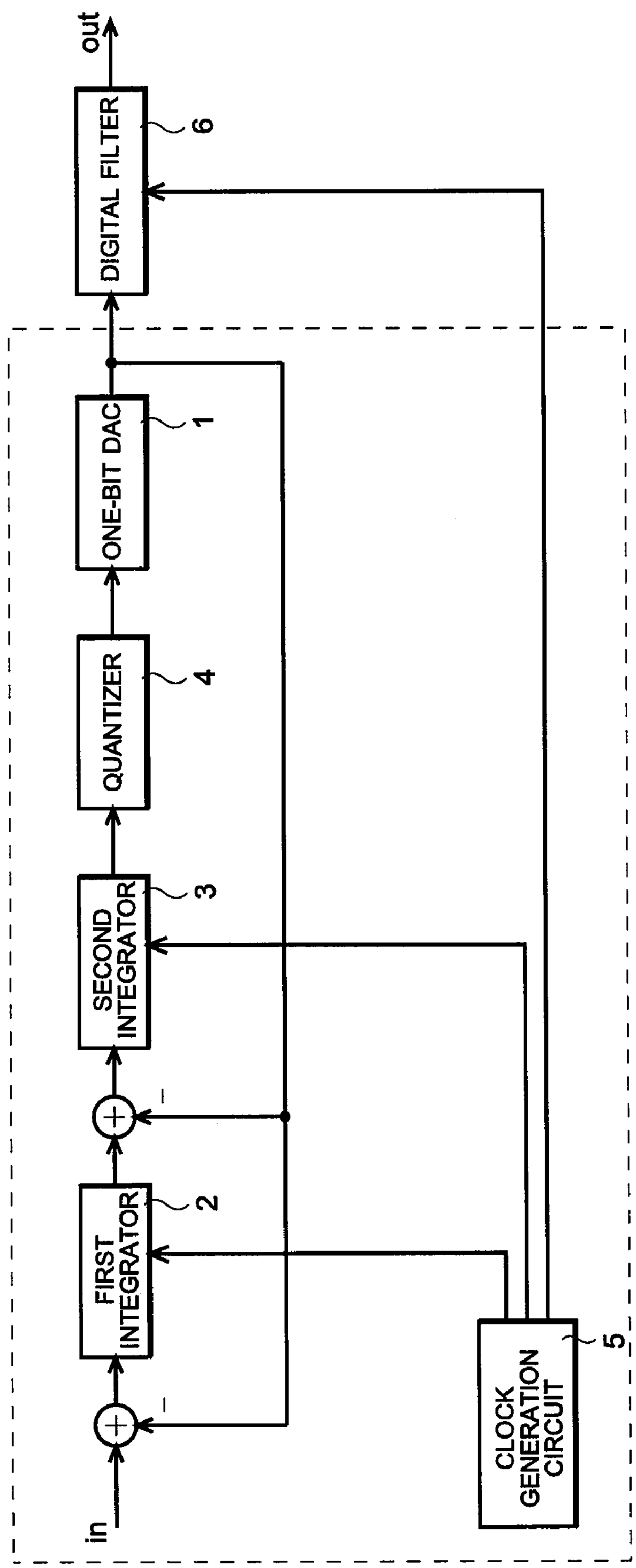
FIG. 7 is a block diagram showing a delta sigma modulator.
Figure 8:
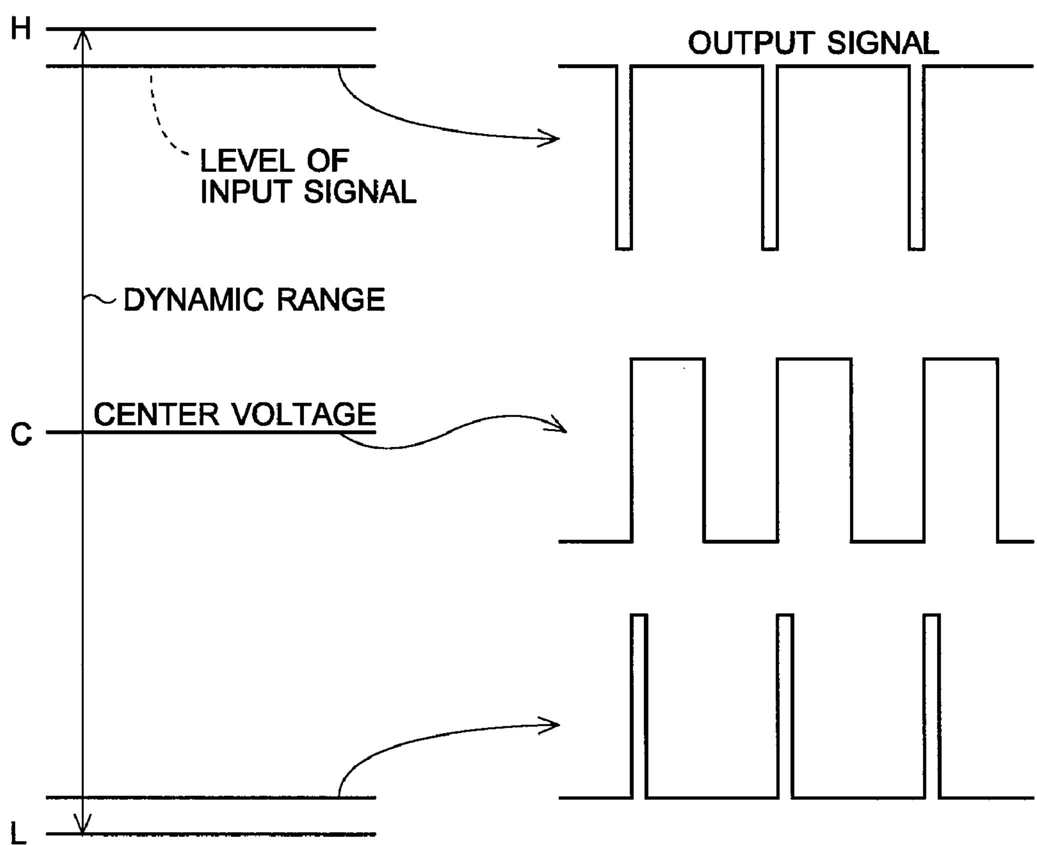
FIG. 8 shows operation of the delta sigma modulator.
Figure 9:
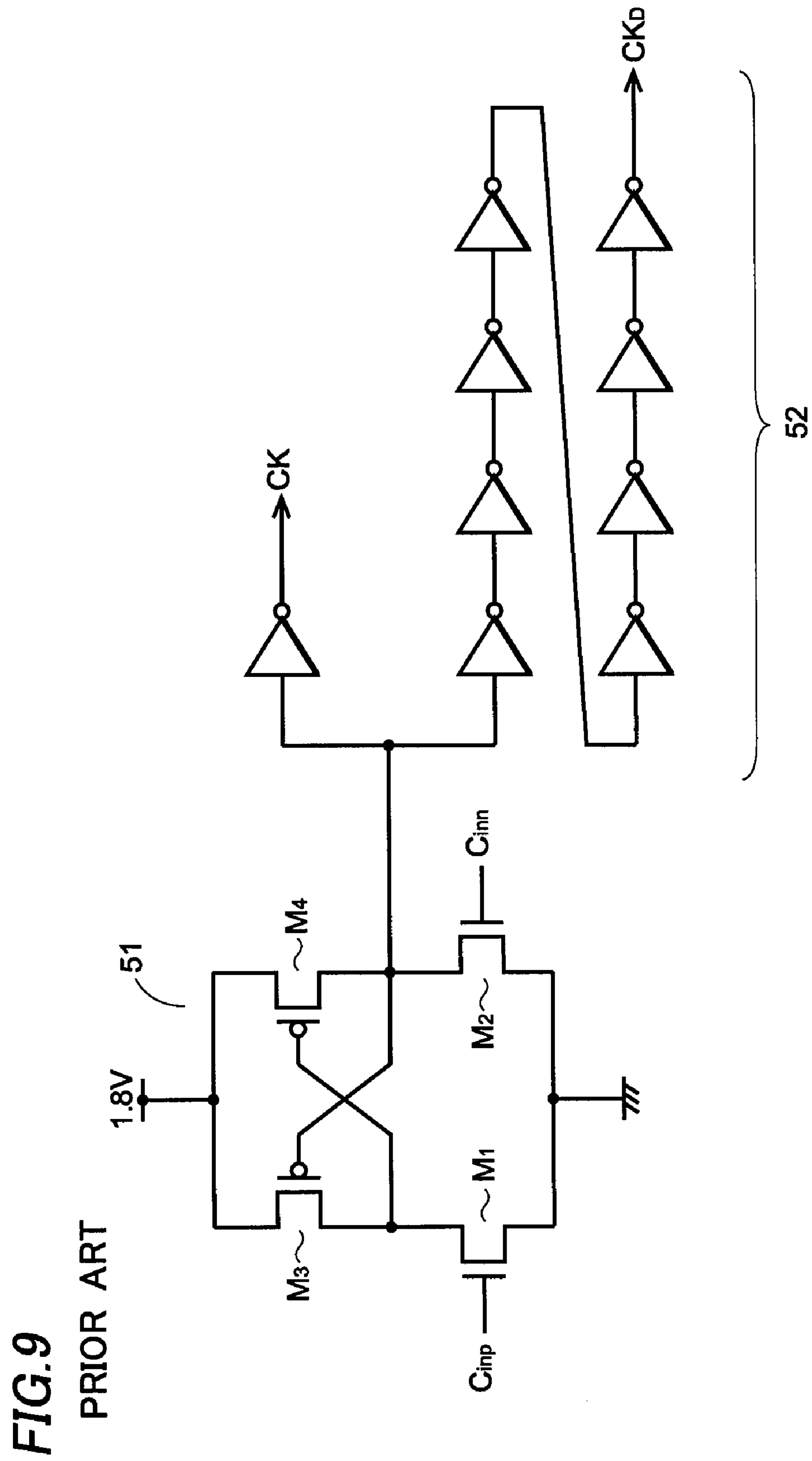
FIG. 9 is a circuit diagram showing a conventional clock producing circuit.

Output voltages of the second integrator 3 are applied to a latching comparator 4A that corresponds to the quantizer 4 in FIG. 7. Output signals from the latching comparator 4A are converted by a one-bit D/A converter 1 into an analog signal that is fed back to the first integrator 2 and the second integrator 3.

The clock generation circuit 5 generates a plurality of clocks to control turning on/off of the switches S1-S4 in the first switching circuit 2A and the switches S5-S10 in the second switching circuit 3A. The plurality of clocks is made of seven clocks Φ1, ΦE, Φ1D, *Φ1D, Φ2, Φ2D and *Φ2D shown in FIG. 2, for example. *Φ1D is a reverse clock of Φ1D, and *Φ2D is a reverse clock of Φ2D.

A power supply of the delta sigma modulator may be composed of a single power supply that generates a positive power supply voltage, a ground voltage GND and a voltage between them (intermediate voltage), or may be composed of two power supplies that generate a positive voltage and a negative voltage relative to the intermediate voltage that is regarded as the ground voltage GND.

Figure 2:
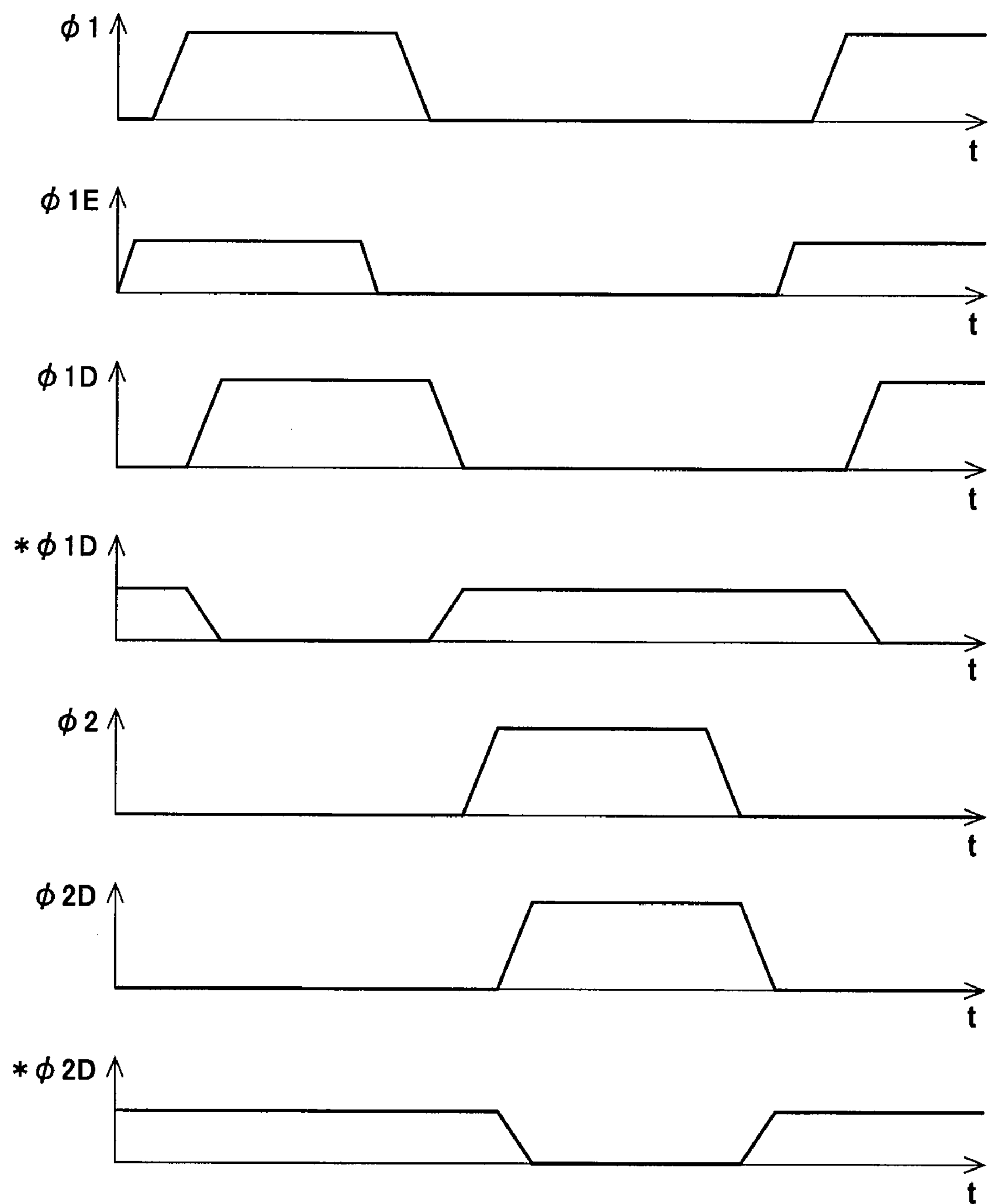
FIG. 2 is a waveform chart of clocks in the delta sigma modulator according to the embodiment of this invention.

An operation of the delta sigma modulator is hereafter described referring to FIG. 1 and FIG. 2.

Step 1: The output signals of the latching comparator 4A are determined at a rising edge of the clock Φ1E and latched. The one-bit D/A converter 1 receives the output signals and outputs the analog signal.

Step 2: The switches S3 and S9 are closed at a rising edge of the clock Φ1.

Step 3: The switches S1, S5 and S7 are closed at a rising edge of the clock Φ1D, that is, at a falling edge of the clock *Φ1D. AS a result, each of the capacitors Cs is charged to a voltage corresponding to a difference between a mid voltage of an amplitude of the analog signal outputted from the one-bit D/A converter 1 and each of the differential input voltages Vip and Vin, respectively, in the first integrator 2 (the first stage). Also, each pair of the capacitors Cs1 and Cs2 is charged to a voltage corresponding to a difference between the mid voltage and each of the output voltages Vo1*p* and Vo1*n* from the first integrator 2 (the first stage), respectively, in the second integrator 2 (the second stage). It is assumed that a capacitance of the capacitor Cs1 is equal to a capacitance of the capacitor Cs2.

Step 4: The clock Φ1E falls to a low level to be prepared for the next rise. The output of the one-bit D/A converter 1 remains unchanged since the output of the latching comparator 4A is latched.

Step 5: The switches S3 and S9 are opened at a falling edge of the clock Φ1.

Step 6: The switches S1, S5 and S7 are opened at a falling edge of the clock Φ1D, that is, at a rising edge of the clock *Φ1D. Charges stored in the capacitors Cs are retained in the first integrator 2 (the first stage). Also, charges stored in the capacitors Cs1 and Cs2 are retained in the second integrator 3 (the second stage).

Step 7: The switches S4 and S10 are closed at a rising edge of the clock Φ2.

Step 8: The switches S2, S6 and S8 are closed at a rising edge of the clock Φ2D, that is, at a falling edge of the clock *Φ2D. The charges stored in the capacitors Cs are transferred to the capacitors C1 in the first integrator 2 (the first stage). Also, the charges stored in the capacitors Cs1 and Cs2 are transferred to the capacitors C1 in the second integrator 3 (the second stage). Because the capacitors Cs1 an Cs2 have the same capacitance, charges corresponding to the mid voltage are cancelled out and only charges corresponding to each of the outputs Vo1*p* and Vo1*n* of the first integrator 2 (the first stage) and the output of the one-bit D/A converter 1 are transferred to each of the capacitors C1 in the second integrator 3 (the second stage).

Step 9: The switches S4 and S10 are opened at a falling edge of the clock Φ2.

Step 10: The switches S2, S6 and S8 are opened at a falling edge of the clock Φ2D, that is, at a rising edge of the clock *Φ2D. After the step 10 is executed, the operation goes back to the step 1 and repeats all the steps described above.

A structure of the clock generation circuit 5 that generates the clocks described above is described hereafter. The clock generation circuit 5 is composed of a ring oscillator 10 and a clock producing circuit 30 that produces the clocks described above from outputs of the ring oscillator 10.

Figure 3:
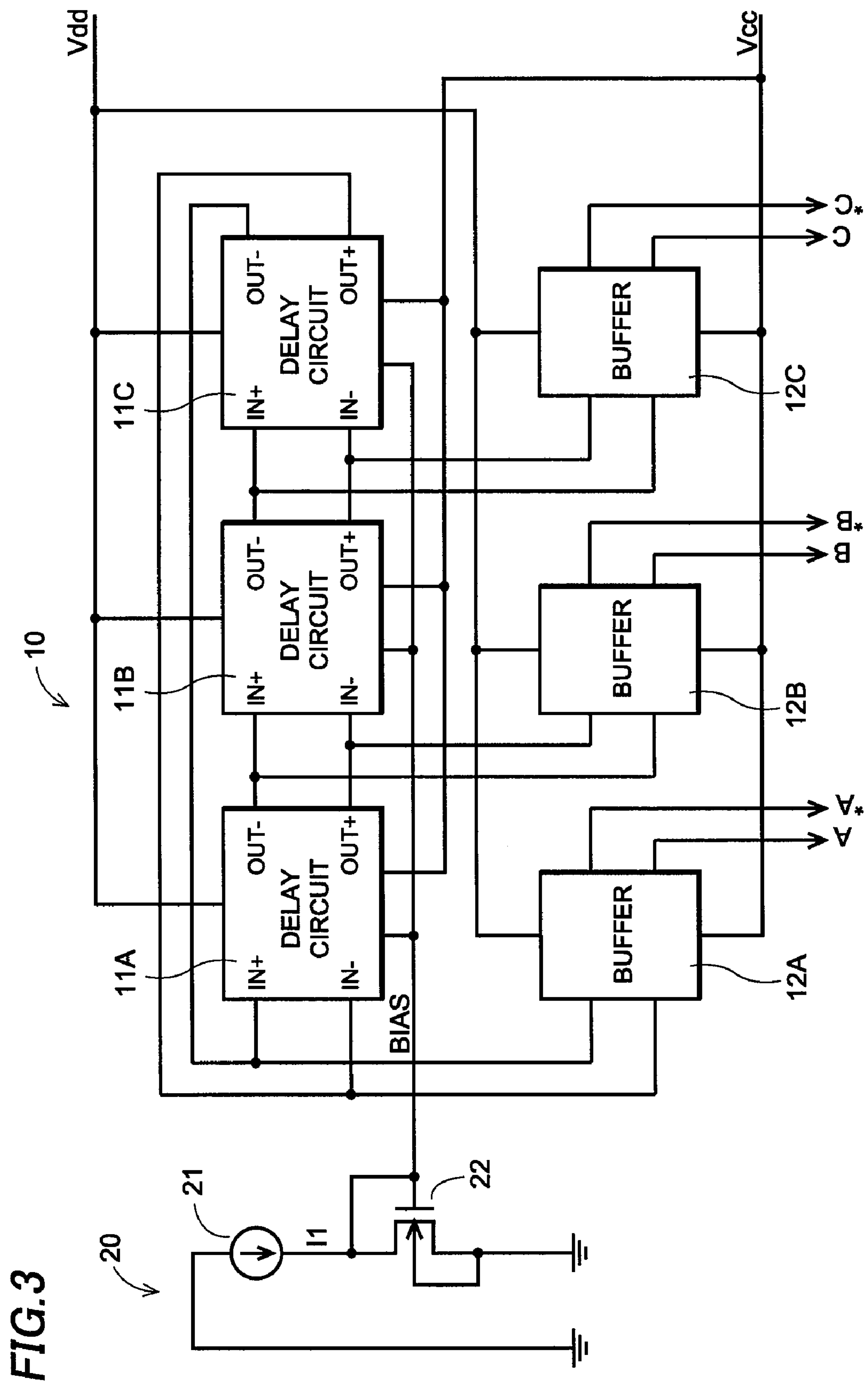
FIG. 3 is a block diagram showing a ring oscillator in the delta sigma modulator according to the embodiment of this invention.
Figure 4:
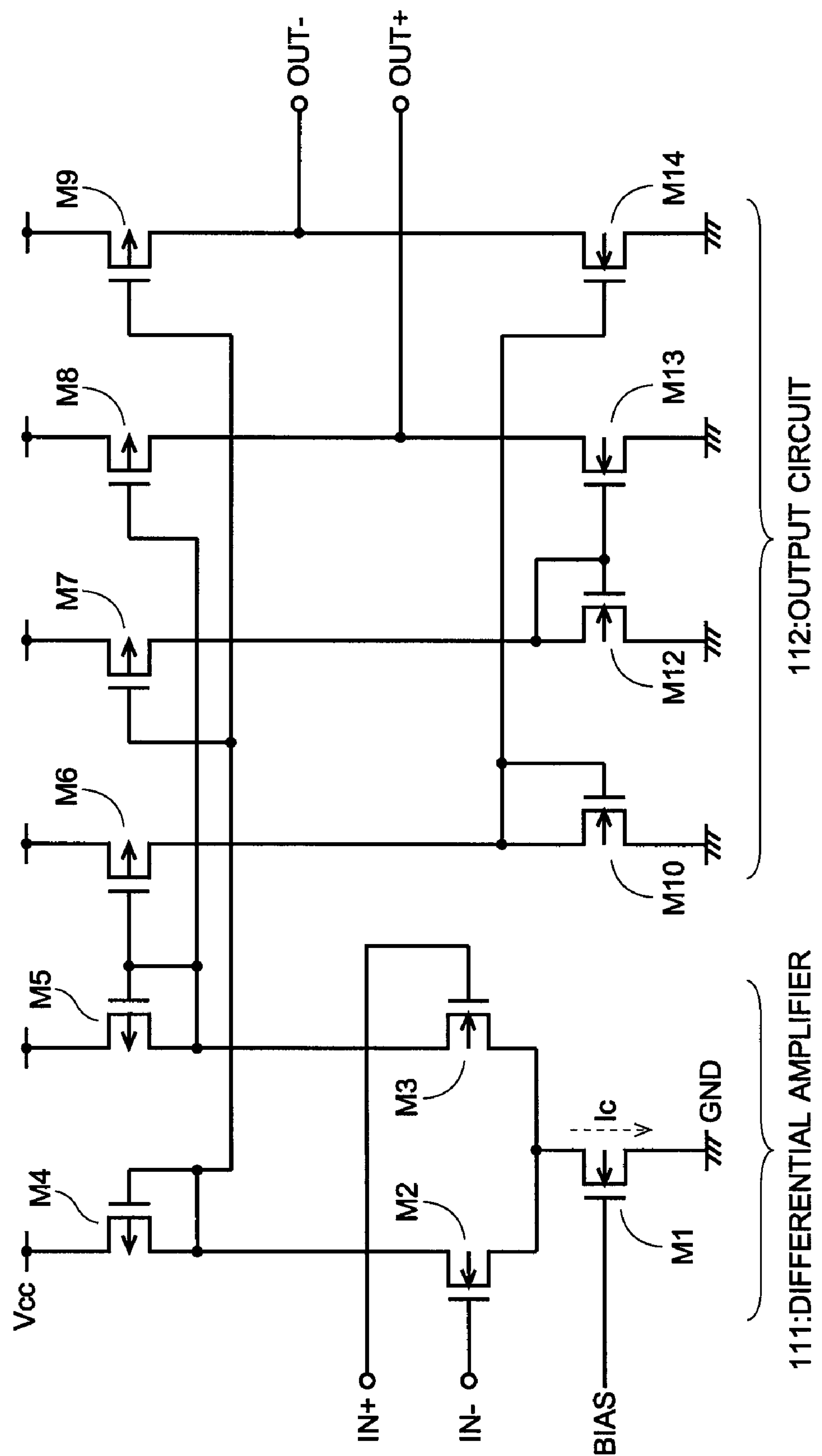
FIG. 4 is a circuit diagram of a delay circuit in the delta sigma modulator according to the embodiment of this invention.

First, a circuit structure of the ring oscillator 10 will be described referring to FIG. 3 and FIG. 4.

The ring oscillator 10 is composed of three delay circuits 11A, 11B and 11C connected in a loop. Each of the delay circuits 11A, 11B and 11C has the same circuit structure and is composed of a differential amplifier 111 and a current mirror type output circuit 112, as shown in FIG. 4.

The differential amplifier 111 is composed of a pair of differential transistor M2 and M3, a tail current transistor M1 through which a drive current (hereafter referred to as a tail current Ic (named after a topographical analogy with an animal tail)) of the differential amplifier 111 flows and current mirror transistors M4 and M5. A gate of the differential transistor M3 serves as a positive input terminal (IN+), while a gate of the differential transistor M2 serves as a negative input terminal (IN−). M1, M2 and M3 are N-channel type MOSFETs, while M4 and M5 are P-channel type MOSFETs. Also, M6-M9 are P-channel type MOSFETs, while M10 and M12-M14 are N-channel type MOSFETs in the output circuit 112.

There is a current generation circuit 20 to provide the tail current transistor M1 with the tail current Ic. The current generation circuit 20 is shared by the differential amplifiers 111 in the three delay circuits 11A, 11B and 11C. The current generation circuit 20 is provided with a current source 21 and an N-channel type current transistor 22 connected in series with the current source 21. A current 11 from the current source 21 flows through the current transistor 22. A gate and a drain of the current transistor 22 are connected together. An output voltage BIAS that is a voltage at the drain as well as a voltage at the gate of the current transistor 22 is supplied to a gate of each of the tail current transistors M1. That is, the current transistor 22 and the tail current transistor M1 in each of the differential amplifiers 111 in the delay circuits 11A, 11B and 11C form a current mirror. With this, the tail current Ic that is proportional to the current I1 from the current source 21 flows through each of the tail current transistors M1. As a result, it is made possible to vary the tail current Ic and consequently to vary an oscillation frequency of the ring oscillator 10 by controlling the current I1 from the current source 21.

When an H level is applied to the positive input terminal (IN+) and an L level is applied to the negative input terminal (IN−) of the differential amplifier 111 in the delay circuit 11A, M3 is turned on and M2 is turned off. Then a current flows through M8 that forms a current mirror together with M5. Also, a current flows through M6 that forms a current mirror together with M5. Furthermore, a current flows through M10 and M14 which form a current mirror. Since M2 is turned off at that time, M4, M7, M12, M13 and M9 are turned off. As a result, a negative output terminal (OUT−) becomes the L level, while a positive output terminal (OUT+) becomes the H level. That is, a reverse signal of a signal applied to the positive input terminal (IN+) is obtained from the negative output terminal (OUT−), while a reverse signal of a signal applied to the negative input terminal (IN−) is obtained from the positive output terminal (OUT+).

Therefore, connecting the negative output terminal (OUT−) to a positive input terminal (IN+) of the differential amplifier 111 in the delay circuit 11B in a subsequent stage while connecting the positive output terminal (OUT+) to a negative input terminal (IN−) of the differential amplifier 111 in the delay circuit 11B in the subsequent stage is the same as connecting two inverters in series. Three-stage ring oscillator is obtained by further connecting the delay circuit 11B to the delay circuit 11C and connecting the delay circuit 11C to the delay circuit 11A in the same way.

Figure 5:
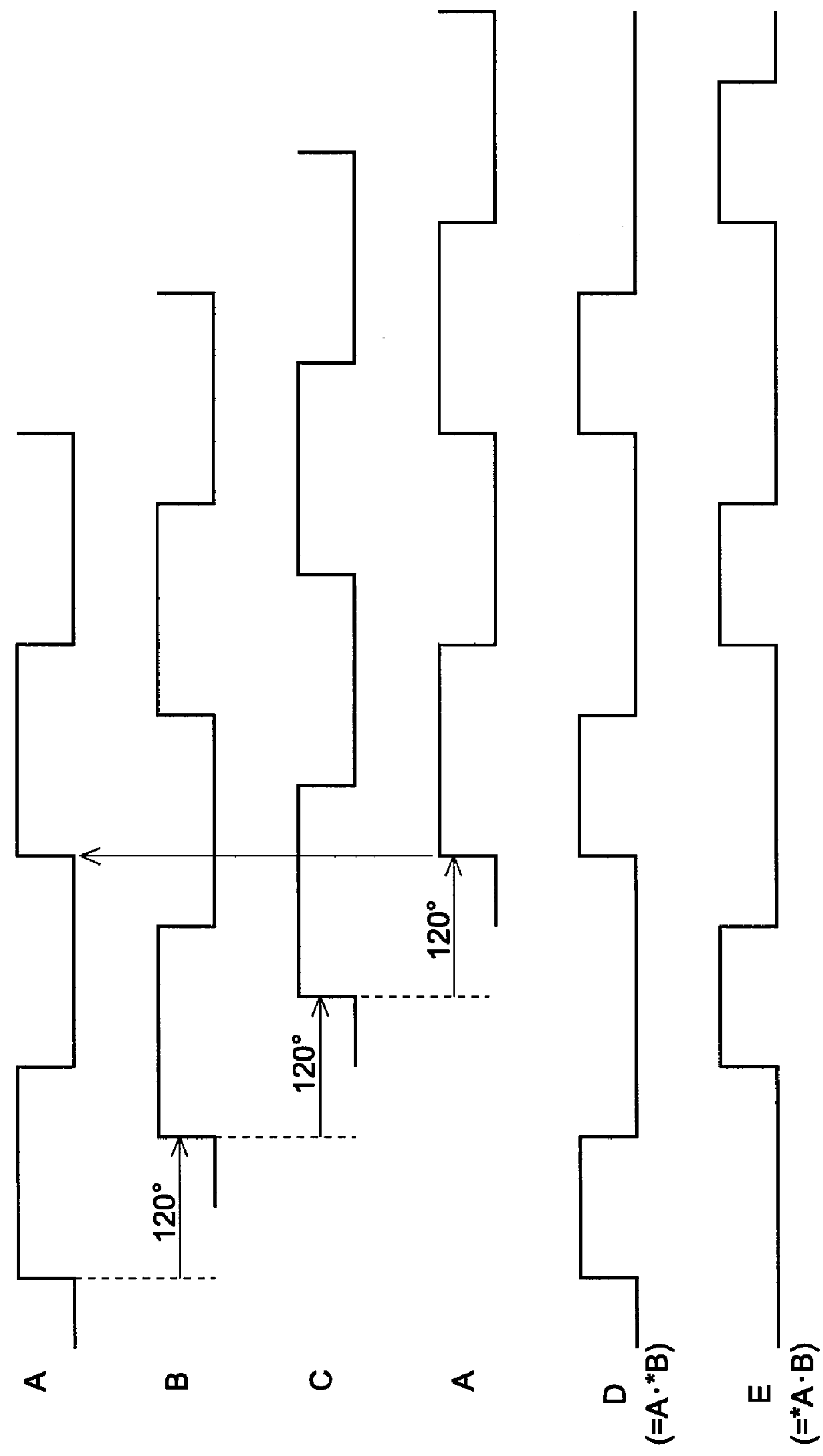
FIG. 5 is a waveform chart of clocks generated by the ring oscillator in the delta sigma modulator according to the embodiment of this invention.

Three-phase clocks are obtained from the positive output terminals (OUT+) and the negative output terminals (OUT−) of the delay circuits 11A, 11B and 11C in the ring oscillator 10. The clocks go through buffers 12A, 12B and 12C, and there are obtained three-phase clocks A, B and C and their reverse clocks *A, *B and *C. The three-phase clocks A, B and C are 120 degrees shifted in phase from each other, as shown in FIG. 5.

Figure 6:
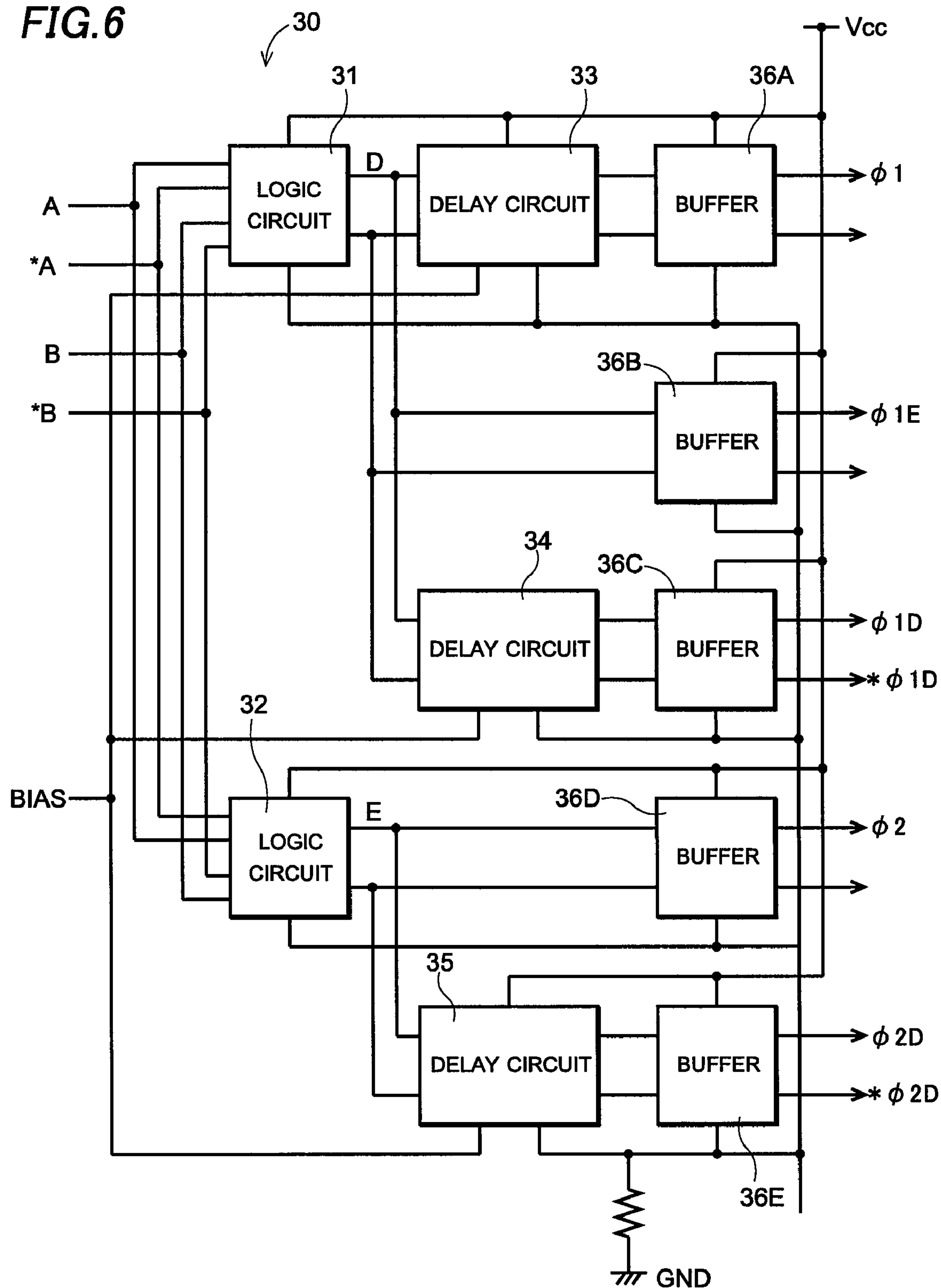
FIG. 6 is a block diagram showing a clock producing circuit in the delta sigma modulator according to the embodiment of this invention.

Next, a circuit structure of the clock producing circuit 30 will be explained referring to FIG. 6. The clock producing circuit 30 produces the plurality of clocks Φ1, Φ1E, Φ1D, *Φ1D, Φ2, Φ2D and *Φ2D to control turning on/off of the switches S1-S4 in the first switching circuit 2A and the switches S5-S10 in the second switching circuit 3A based on the clocks generated by the ring oscillator 10. The clock producing circuit 30 is composed of two logic circuits 31 and 32, three delay circuits 33, 34 and 35 and five buffer circuits 36A-36E. The three delay circuits 33, 34 and 35 are structured in the same way as the delay circuits 11A, 11B and 11C in the ring oscillator 10 and provided with the tail current Ic from the current generation circuit 20. That is, the current transistor 22 in the current generation circuit 20 and the tail current transistor M1 in each of the differential amplifiers 111 in the delay circuits 33, 34 and 35 form a current mirror. That is, the tail current Ic that is proportional to the current I1 from the current source 21 flows through the tail current transistor M1.

An amount of the tail current Ic in each of the differential amplifiers 111 in the delay circuits 33, 34 and 35 is proportional to a size (a channel width, for example) of the respective tail current transistor M1, and can be set arbitrarily. Delay time of the clocks generated in the delay circuits 33, 34 and 35 can be set accordingly. A channel width of the tail current transistor M1 in the delay circuit 34 is designed smaller than a channel width of either of the tail current transistors M1 in the delay circuits 33 and 35 in this embodiment. Therefore, the delay time of the clocks produced through the delay circuit 34 is set to be longer than the delay time of the clocks produced through either of the delay circuits 33 and 35. The channel widths of the tail current transistors M1 in the delay circuits 33 and 35 are designed equal to each other.

The logic circuit 31 performs logical multiplication of the clocks A and *B to generate a clock D. Also, the logic circuit 32 performs logical multiplication of the clocks *A and B to generate a clock E. As a result, the clocks D and E are made to have no high level overlapping with each other. The clock D is inputted to the buffer circuit 36B, and the clock Φ1E is obtained from an output terminal of the buffer circuit 36B.

Also, the clock D is delayed by the delay circuit 33 and inputted to the buffer circuit 36A. The clock Φ1 is obtained from an output terminal of the buffer circuit 36A. The clock Φ1 is delayed relative to the clock Φ1E. Also, the clock D is delayed by the delay circuit 34 and then inputted to the buffer circuit 36C. The clock Φ1D and its reverse clock *Φ1D are obtained from output terminals of the buffer circuit 36C. The clock Φ1D is even more delayed than the clock Φ1. That is because the delay time produced through the delay circuit 34 is longer than the delay time produced through the delay circuit 33.

The clock E is inputted to the buffer circuit 36D, and the clock Φ2 is obtained from an output terminal of the buffer circuit 36D. Also, the clock E is delayed by the delay circuit 35 and then inputted to the buffer circuit 36E. The clock Φ2D and its reverse clock *Φ2D are obtained from output terminals of the buffer circuit 36E.

The seven clocks Φ1, ΦE, Φ1D, *Φ1D, Φ2, Φ2D and *Φ2D are produced as described above. According to the embodiment of this invention, all the tail currents Ic in the differential amplifiers 111 in the delay circuits 11A, 11B and 11C in the ring oscillator 10 and the tail currents Ic in the differential amplifiers 111 in the delay circuits 33, 34 and 35 in the clock producing circuit 30 vary proportionately with the current I1 from the current source 21. Therefore, the relative magnitudes among the tail currents are maintained, regardless the value of the current I1. When the oscillation frequency of the ring oscillator 10 is modified by changing the current I1 from the current source 21, the delay times of the clocks produced in the delay circuits 33, 34 and 35 are modified accordingly.

For example, when the oscillation frequency of the ring oscillator 10 is increased by increasing the current I1 from the current source 21, the delay times of the clocks produced through the delay circuits 33, 34 and 35 are reduced. On the other hand, when the oscillation frequency of the ring oscillator 10 is reduced by reducing the current I1 from the current source 21, the delay times of the clocks produced through the delay circuits 33, 34 and 35 are increased. That maintains the correlations among the phases of the seven clocks Φ1, Φ1E, Φ1D, *Φ1D, Φ2, Φ2D and *Φ2D.

Also, when the delta sigma A/D converter is structured by inputting the output of the delta sigma modulator into a digital filter 6, an operational clock of the digital filter 6 can be synchronized with the clocks of the delta sigma modulator by producing the operational clock using the clock producing circuit 30 in the same way as the seven clocks Φ1, Φ1E, Φ1D, *Φ1D, Φ2, Φ2D and *Φ2D are produced. As a result, even when a cutoff frequency of the digital filter is modified by changing a frequency of the operational clock, the operation of the delta sigma modulator can be made to follow the modification accordingly to stabilize the A/C conversion.

Needless to say, this invention is not limited to the embodiment described above and may be modified within the scope of the invention. For example, although the second order delta sigma modulator that has the two integrators is described as an example in the embodiment, this invention may be applied to a first order delta sigma modulator that has a single integrator. Also, although the input signal is given as the differential signals, the input signal may be given in a form of an ordinary input signal and the circuit structures of the integrator and the clock generation circuit may be modified accordingly.

With the delta sigma modulator according to the embodiment of this invention, the clocks required to control the switching circuit can be easily generated and the correlation among the phases of the plurality of clocks can be automatically maintained while the frequency of the clocks is modified.

Also, when the delta sigma A/D converter is structured by connecting the output of the delta sigma modulator to the digital filter and the cutoff frequency of the digital filter is modified by changing the frequency of the operational clock, the operation of the delta sigma modulator can be made to follow the modification accordingly by synchronizing the operational clock of the digital filter with the clocks of the delta sigma modulator to stabilize the A/C conversion.

What is claimed is:

1. A delta sigma modulator comprising:

an integrator comprising a switching circuit;

a D/A converter that converts an output of the integrator into an analog output and feeds the analog output back to the integrator; and a clock generation circuit comprising a ring oscillator comprising a plurality of first differential amplifiers connected to each other so as to generate a first set of clocks having phases different from each other and a plurality of second differential amplifiers delaying the first set of clocks generated by the first differential amplifiers so as to generate a second set of clocks, wherein the switching circuit is configured to be controlled by the second set of clocks, and a plurality of tail currents flowing through the first differential amplifiers and the second differential amplifiers is configured to vary so as to maintain the same relative magnitudes among the tail currents.

2. The delta sigma modulator of claim 1, further comprising a current source and a plurality of current mirror circuits, each of the current mirror circuits providing each of the first and second differential amplifiers with a tail current proportional to a current supplied from the current source, respectively.

3. A delta sigma A/D converter comprising:

an integrator comprising a switching circuit;

a D/A converter that converts an output of the integrator into an analog output and feeds the analog output back to the integrator;

a digital filter receiving the analog output; and a clock generation circuit comprising a ring oscillator comprising a plurality of first differential amplifiers connected to each other so as to generate a first set of clocks having phases different from each other and a plurality of second differential amplifiers delaying the first set of clocks generated by the first differential amplifiers so as to generate a second set of clocks, wherein the switching circuit is configured to be controlled by the second set of clocks, the digital filter is configured to be controlled by one of the second set of clocks, and a plurality of tail currents flowing through the first differential amplifiers and the second differential amplifiers is configured to vary so as to maintain the same relative magnitudes among the tail currents.

4. The delta sigma A/D converter of claim 3, further comprising a current source and a plurality of current mirror circuits, each of the current mirror circuits providing each of the first and second differential amplifiers with a tail current proportional to a current supplied from the current source, respectively.

* * * * *